(12) United States Patent
Steigerwald

(10) Patent No.: US 7,052,996 B2
(45) Date of Patent: May 30, 2006

(54) ELECTROCHEMICALLY POLISHING CONDUCTIVE FILMS ON SEMICONDUCTOR WAFERS

(75) Inventor: Joseph M. Steigerwald, Forest Grove, OR (US)

(73) Assignee: Intel Corporation, Santa Clara, CA (US)

( * ) Notice: Subject to any disclaimer, the term of this patent is extended or adjusted under 35 U.S.C. 154(b) by 121 days.

(21) Appl. No.: 10/722,801

(22) Filed: Nov. 26, 2003

(65) Prior Publication Data

US 2005/0112897 A1 May 26, 2005

(51) Int. Cl.
*H01L 21/302* (2006.01)
*H01L 21/461* (2006.01)

(52) U.S. Cl. ...................... 438/692; 438/959
(58) Field of Classification Search ............ 438/697, 438/959, 928, 693, 612, 692

See application file for complete search history.

(56) References Cited

U.S. PATENT DOCUMENTS

| 5,329,734 | A | * | 7/1994 | Yu ............................... 451/41 |
| 5,554,064 | A | * | 9/1996 | Breivogel et al. ............ 451/41 |
| 5,575,706 | A | * | 11/1996 | Tsai et al. .................... 438/693 |
| 5,899,745 | A | * | 5/1999 | Kim et al. ................... 438/692 |
| 6,709,981 | B1 | * | 3/2004 | Grabbe et al. .............. 438/692 |
| 6,802,955 | B1 | * | 10/2004 | Emesh et al. ............... 205/662 |

\* cited by examiner

*Primary Examiner*—S. V. Clark
(74) *Attorney, Agent, or Firm*—Trop, Pruner & Hu, P.C.

(57) ABSTRACT

An electropolish process may remove a conductive film from a semiconductor wafer. An electropolish apparatus having a pad over a platen may make surface-to-surface electrical contact with the conductive film of the wafer across the entire surface of the pad and the conductive film on the wafer. An electric field may be applied through openings in the pad and electrodes which receive potential by feedthroughs that extend through the platen to those electrodes. The electrodes in the feedthroughs may be electrically isolated from the pad and the platen. As a result, more uniform application of electrical potential across the surface to be polished may be achieved in some embodiments.

9 Claims, 1 Drawing Sheet

ELECTROCHEMICALLY POLISHING CONDUCTIVE FILMS ON SEMICONDUCTOR WAFERS

BACKGROUND

This invention relates generally to processing integrated circuits.

In the course of semiconductor wafer fabrication, a metal film formed on a semiconductor wafer may be polished. Conventionally, electrochemical polishing may be utilized. An abrasive fluid may be applied between the metal surface of the semiconductor wafer and a polishing platen. A potential may be applied between the semiconductor wafer and the polishing platen and the platen and semiconductor wafer may be counter rotated. As a result, the metal film may be polished.

Generally electropolish processes need uniform electrical contact to the metal film being polished. One limitation of electropolish processes is that the electrical contact to the film is made via contact to the edge of the wafer or at a few discrete points on the front of the wafer.

Thus, the electropolish process is dependent on the resistance of the film between the contact point and the area of the film being polished. As the film is thinned, the resistance of the film increases and eventually the film becomes discontinuous. As a result, the removal process is significantly slowed and may subsequently be halted in some areas.

Thus, conventional electropolish processes suffer from an inability to remove the entire metal film due to the increase in resistivity at the end of the process. Patches of metal may remain at the end of the conventional process.

Thus, there is a need for better ways to implement electrochemical polishing.

DETAILED DESCRIPTION

Figure 1:
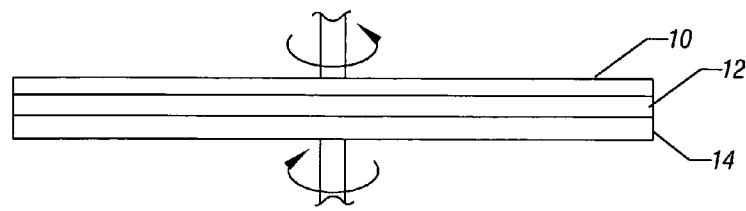
FIG. 1 is a side elevational view of one embodiment of the present invention.

Referring to FIG. 1, a semiconductor wafer 10 with a downwardly facing conductive surface may be rotated in a first direction indicated by a counterclockwise arrow. An electropolish platen 14 and pad 12 may be rotated in the opposite direction indicated by a clockwise arrow. As a result, the conductive film on the wafer 10 may be electropolished.

In some cases, an abrasive polish fluid material may be used between the semiconductor wafer 10 and the pad 12. Pressure may or may not be exerted.

Figure 2:
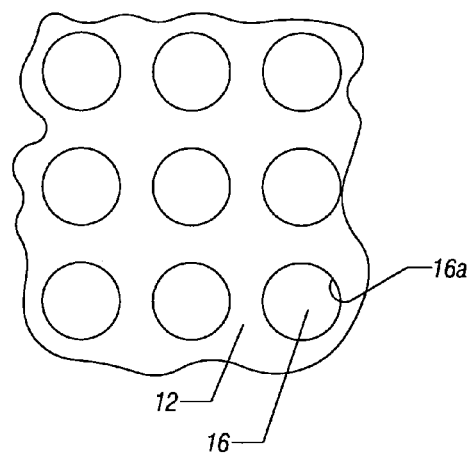
FIG. 2 is a partial, greatly enlarged, top plan view of a portion of the pad in accordance with one embodiment of the present invention.

Referring to FIG. 2, the upper surface of the pad 12 includes an array of regularly spaced, cut-out regions 16a. In one embodiment, these cut-out regions 16a have the circular configuration shown in FIG. 2. As a result, electrical contact may be made through the pad 12 to the conductive surface of the semiconductor wafer 10. At the same time, an electric field may be applied through the cut-out region 16a to the conductive surface of the semiconductor wafer 10. Therefore, electrical contact can be made directly to the conductive film on the semiconductor wafer 10 and an electric field may still be applied to that wafer.

Figure 3:
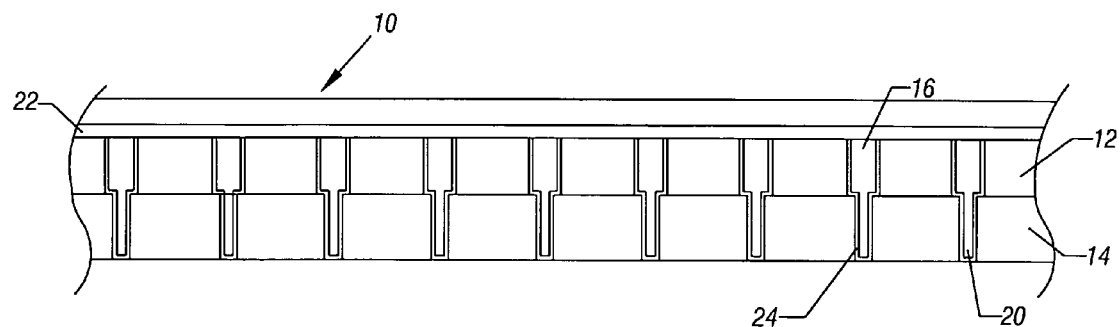
FIG. 3 is an enlarged, partial, vertical, cross-sectional view through a portion of the wafer pad and platen shown in FIG. 1 in accordance with one embodiment of the present invention.

Referring to FIG. 3, the platen 14 may have a passage formed therethrough which allows a feedthrough 20 to provide electrical communication to a counter electrode 16. The counter electrode 16 is exposed by the cut-out region 16a formed in the pad 12. Thus, an electrical potential may be supplied through the platen 14 (from the bottom side) to the electrode 16 to set up an electric field between the conductive film 22 of the semiconductor wafer 10 and the counter electrode 16. The conductive film 22 may be a metal layer to be polished in one embodiment.

An insulative film 24 separates the feedthrough 20 and the counter electrode 16 from the pad 12 and the platen 14. In one embodiment, the pad 12 and the platen 14 are electrically conductive so that an electrical potential may be conveyed through the platen 14 to the pad 12 and thereafter to the film 22. Thus, the film 22 is at one polarity and the counter electrode 16 is at another polarity, setting up an electric field. The circularly shaped edge of the cut-out region 16a may be effective in providing a polishing action.

An electrical potential may be provided through the insulative film 24 upwardly from below to the feedthrough 20 to the electrode 16 in one embodiment of the present invention. A potential of the opposite polarity is applied from below the platen 14 to the film 22 via the conductive platen 14 and pad 12, in one embodiment. The electric field between the film 22 and the counter electrode 16 may be proportional to the voltage difference between the platen 14 and the electrode 16 in one embodiment of the present invention. That electric field drives the electrochemical polish process. The pad 12 serves the dual function of providing an abrasive surface, as well as electrical contact to the film 22 being polished.

Thus, in some embodiments, uniform electrical contact may be made to the film 22 being polished. As a result, the electropolish process may be less dependent on the resistance of the film 22 because a wide contact surface may be had between the film 22 and the pad 12 in some embodiments. As a result, the film 22 removal process may not be significantly slowed or halted in some areas. This may improve the ability to remove the entire film 22 in some embodiments.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:
   positioning a conductive surface of a semiconductor wafer on a conductive polishing pad;
   providing electrical contact of a first polarity to said surface across the pad; and
   providing electrodes in contact with said surface, said electrodes extending through said pad, said electrodes being of opposite polarity to said first polarity.

2. The method of claim 1 including providing circularly shaped openings in said pad over said electrodes.

3. The method of claim 1 including positioning said pad over a conductive platen.

4. The method of claim 2 including insulating said electrode from said pad.

5. The method of claim 1 including providing said pad over a conductive platen and applying potential to said film through said pad and platen.

6. The method of claim 1 including providing electrical contact to said surface over the entire extent of said surface.

7. The method of claim 1 including applying pressure between said surface and said pad.

8. The method of claim 1 including providing an abrasive fluid between said surface and said pad.

9. The method of claim 1 including counter rotating said pad and said surface.

* * * * *